United States Patent [19]

Pollacek

[11] Patent Number: 4,917,286
[45] Date of Patent: Apr. 17, 1990

[54] BONDING METHOD FOR BUMPLESS BEAM LEAD TAPE

[75] Inventor: James Pollacek, Corvallis, Oreg.

[73] Assignee: Hewlett-Packard Company, Palo Alto, Calif.

[21] Appl. No.: 280,065

[22] Filed: Dec. 1, 1988

Related U.S. Application Data

[62] Division of Ser. No. 52,666, May 20, 1987, abandoned.

[51] Int. Cl.⁴ ........................................... H01L 21/88
[52] U.S. Cl. .................................. 228/110; 228/118; 228/180.2
[58] Field of Search .................. 228/180.2, 110, 111, 228/118

[56] References Cited

U.S. PATENT DOCUMENTS 3,698,075 10/1972 Boyle .................................. 228/110
3,954,217 5/1976 Smith .................................. 228/110

OTHER PUBLICATIONS

*IBM Technical Disclosure Bulletin*, vol. 25, No. 4, Sep. 1982; See Edwards, pp. 1948–1949.

*Primary Examiner*—Kenneth J. Ramsey
*Attorney, Agent, or Firm*—Roland I. Griffin

[57] ABSTRACT

A tape automated bonding method and structure is disclosed. Interconnection using prepatterned metal beam tape interconnect is accomplished by providing vias in passivation layers overlaying a metal region in or on the major surface of the device which is to receive the interconnect leads, eliminating the requirement for bonding pad bumps. Ultrasonic pressure is applied to the beams as they superpose the vias, bonding each lead to its respective metal region.

5 Claims, 3 Drawing Sheets

BONDING METHOD FOR BUMPLESS BEAM LEAD TAPE

This is a division of application Ser. No. 052,666, filed May 20, 1987, now abandoned.

BACKGROUND OF THE INVENTION

1. Field of the Invention

The present invention relates generally to tape automated bonding (TAB) of thin film structures and, more particularly, to a bumpless, single point TAB process and structure.

2. Description of the Related Art

In the manufacture of electronic devices (for example, thin-film structures such as for thermal ink-jet resistor array devices or semiconductor integrated circuits (IC), it has become feasible to make a large number of metallic interconnections to microscopic pads on the structure by utilizing a roll-type, metal film cut to form an individual set of leads, commonly known as "beam tape." The beam tape can be patterned in customized sections to match the interconnections required for the particular application. At an automated bonding station, the beam tape and structure are brought together by various known processes to connect the leads to the structure.

Generally, a precision ground thermode applies heat and pressure to the metal beams and underlying, raised, interconnection weld-spot bumps (known as "bonding pads") which lie generally atop the structure to be connected. Both high temperature thermocompression welding and lower temperature, lower pressure solder reflow welding are known, particularly for "gang-bonding" (where all welds are made simultaneously on the structure). Individual circuits may be bonded to inner leads of the beam tape and then tested while still in continuous tape form.

Two-layer beam tape is fabricated with a polyimide film to facilitate the bonding process where it is desirable to have such a dielectric barrier between the lead traces and the structure to be interconnected.

A known, typical technique is described in U.S. Pat. No. 4,551,912 (Marks, et al.). In that patent, a method of forming semiconductor chips is shown wherein a continuous sheet TAB material is moved to a cutting station. By computer control, a laser forms a "footprint" (pattern for the device to be attached) the material is moved to a bonding station where it is aligned with the chip, and a computer controlled bonding tool (an ultrasonic probe) sequentially bonds each lead in the pattern to a corresponding bump (raised interconnection weld spot) previously fabricated into the chip structure.

Typical bump height is 1.0 to 1.5 mils above the die major surface. Alternatively, prebumped beams are provided by beam tape manufacturers.

A difficulty with the Marks, et al. system is the requirement of the bumps. Column 4, lines 4–27. Basically, this technique is used to prevent short circuits from occurring between the lead and the peripheral edge of the semiconductor material of the substrate. In addition to IC fabrication process difficulties and expenses added to the chips to include the bonding bumps, in other technologies, such as a thin-film structure for an ink-jet printhead, topology requirements may severely limit or even prohibit the inclusion of bumps.

Moreover, heat bonding, such as by laser or thermode probes, may be inapplicable to structures not designed to withstand high temperature excursions.

Hence, there is a need for a heatless and bumpless TAB technique.

SUMMARY OF THE INVENTION

It is an advantage of the present invention that it provides a heatless TAB process.

Another advantage of the present invention is that it eliminates the need for bonding bumps on the structure to be TAB interconnected, thus improving both yield and cost per wafer.

A further advantage of the present invention is that it provides a TAB process which can be used to form connections on places of the structure other than the periphery.

Yet a further advantage of the present invention is that it allows the structure to be placed in a package before bonding.

Still another advantage is that the present invention allows the forming of jumper interconnects between different sections of the structure.

In a basic aspect, the present invention provides a thin-film structure for tape automated bonding, comprising:

a substrate layer having a first, substantially planar surface;

at least one conductive region in said first surface;

a passivation layer superjacent said first surface, having a first aperture superjacent at least a substantial area of said region; and, a barrier layer superposing said passivation layer, having a second aperture superjacent to and encompassing said first aperture, such that an interconnect beam can be bonded to said conductive region through said first and second apertures.

Other objects, features and advantages of the present invention will become apparent upon consideration of the following detailed description and the accompanying drawings, in which like reference designations represent like features throughout the FIGURES.

The drawings referred to in this description should be understood as not being drawn to scale except if specifically noted.

DETAILED DESCRIPTION OF THE INVENTION

Reference is made now in detail to a specific embodiment of the present invention, which illustrates the best mode presently contemplated by the inventor(s) for practicing the invention. Alternative embodiments are also briefly described as applicable. It should be recognized that many publications describe the details of common techniques used in the fabrication processes of integrated circuit components and other thin film devices. See, e.g., Ghandhi, S.K., VISI Fabrication Principles, copyright 1983, John Wiley & Sons, or Semiconductor & Integrated Circuit Fabrication Techniques, Reston Publishing Co., Inc., copyright 1979 by the Fairchild Corporation. Those techniques can be generally employed in the fabrication of the structure of the present invention. Moreover, the individual steps of such a process can be performed using commercially available integrated circuit fabrication machines. As specifically helpful to an understanding of the present invention, approximate technical data are set forth based upon current technology. Future developments in this art may call for appropriate adjustments as would be obvious to one skilled in the art.

Figure 1:
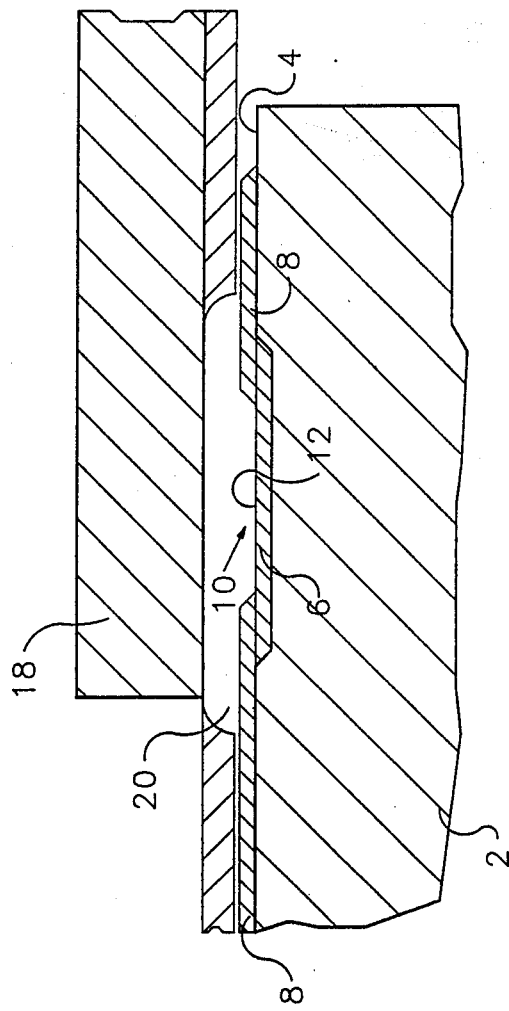
FIG. 1 is a cross-sectional drawing of the present invention structure in position for bonding taken in plane A—A of FIG. 2.
Figure 2:
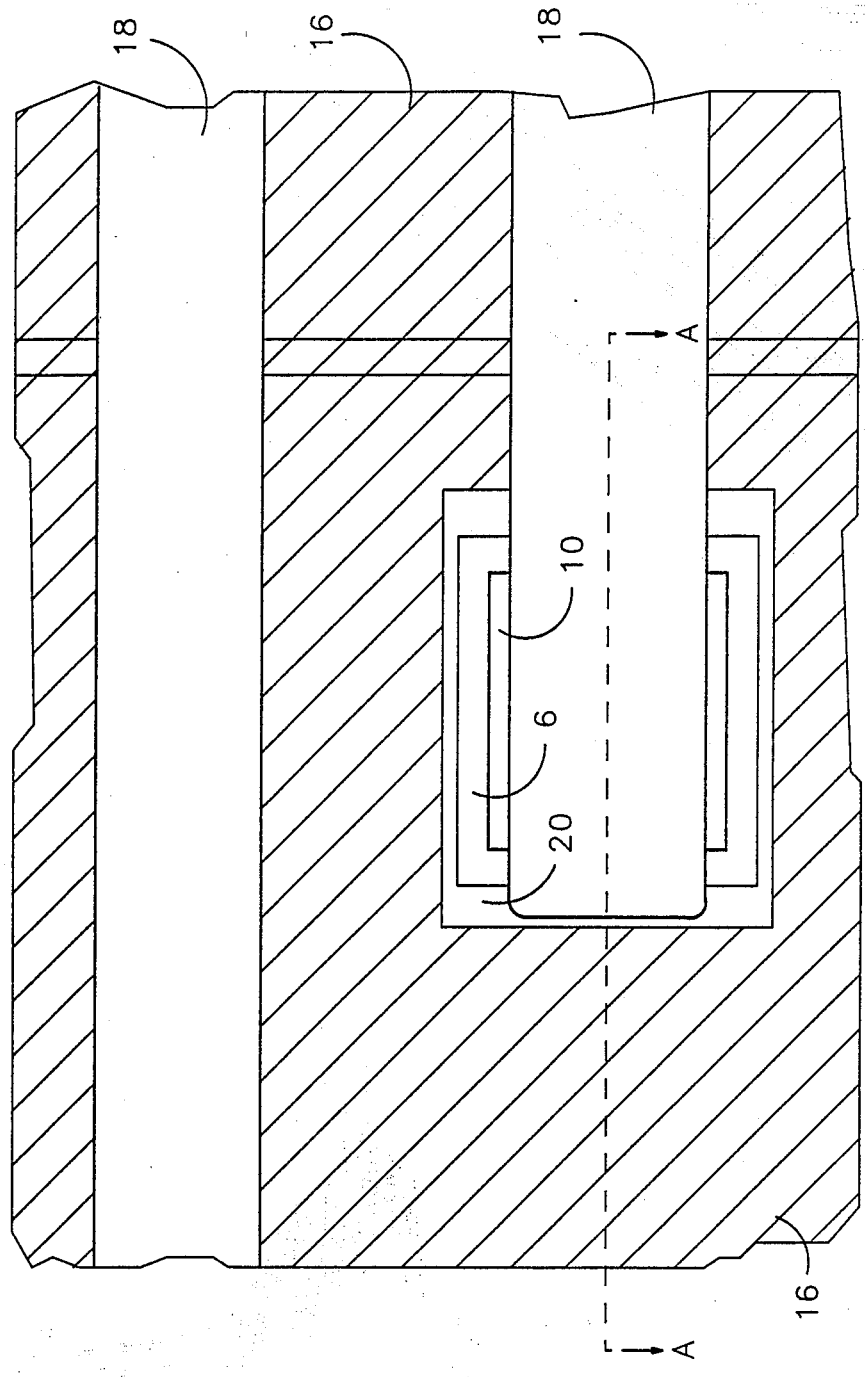
FIG. 2 is a plan view (top) showing two trace beams in position for bonding in accordance with the present invention.

Referring now to FIG. 1, a structure formed in accordance with the present invention is shown in cross-section (taken in plane A—A as shown in FIG. 2). As will be apparent to a person skilled in the art, the depiction is only intended to be of a small section of an entire device, such as an edge of an integrated circuit chip.

A substrate 2, such as silicon IC die, has a first surface 4. A bonding pad 6 is formed in or on the substrate surface 4. The pad 6 may be formed by any one of the known techniques such as metal deposition and etching to desired geometry. For the purpose of the present invention, the pad 6 should be formed of aluminum to a thickness in the range of 0.3 to 1.0 micron. In the preferred embodiment, the thickness is approximately 0.5 micron.

A passivation layer 8 is formed on substrate surface 4. Many well-known materials, such as silicon dioxide, silicon nitride, silicon oxynitride, and silicon carbide, or combinations thereof, can be used to form the passivation layer 8. The passivation layer 8 should have a thickness in the range of 0.5 to 3.0 microns. In the preferred embodiment, the thickness is approximately 1.38 microns, comprising a combination of silicon nitride and silicon carbide. In the preferred embodiment, the passivation layer 8 comprises a three-stack layer where the bottom layer is silicon nitride which is 0.52 micron thick; the middle layer is formed of silicon carbide which is 0.26 micron thick; and the top layer is tantalum, which is 0.6 micron thick.

An aperture, or via, 10 is etched to expose at least a portion of the surface 12 of pad 6. Again, there are several well-known techniques for forming such a via 10. In the preferred embodiment, via 10 is formed by wet-etch for the tantalum and a plasma dry-etch for the middle and bottom layers.

In the preferred embodiment, the aperture 10 has an area of approximately 0.0040 inch square.

Figure 3:
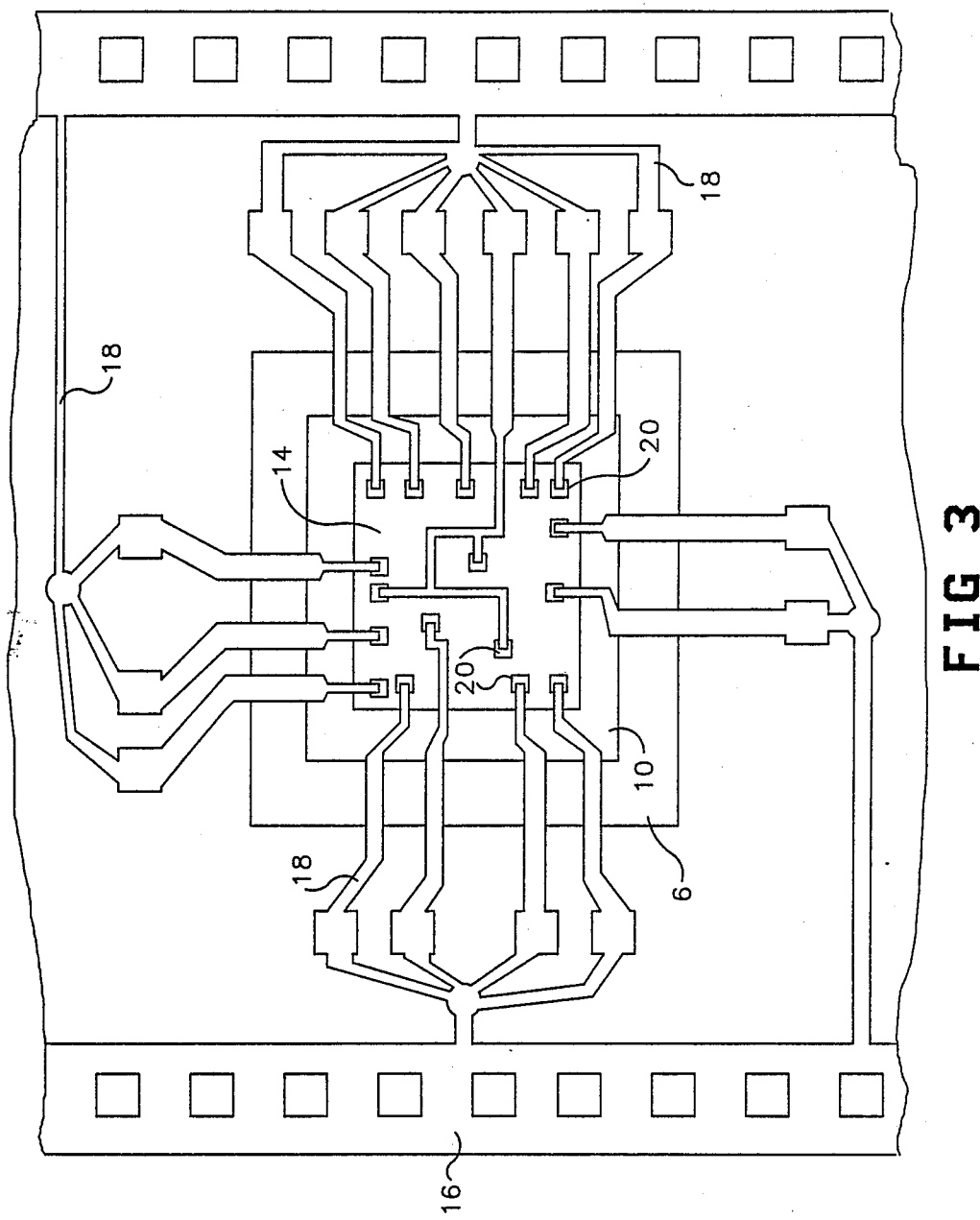
FIG. 3 is a plan view (top) showing an interconnect layout for a thin-film structure in accordance with the present invention.

Referring briefly to FIG. 3, an entire chip 14 is encased in a polyimide tape 16. The polyimide has a thickness of approximately 0.0005 inch. In accordance with a predetermined pattern matching the pattern of the bonding pads 6 on the structure to be interconnected, vias 20 are etched in the polyimide. While there are several known techniques for forming the pattern of polyimide vias 20, in the preferred embodiment, common chemical milling is used.

As shown in FIG. 1, the polyimide vias 20 are greater in area than passivation layer vias 10 in order to allow room for the beam being attached and registration misalignments. In the preferred embodiment, the aperture 20 has an area of approximately 0.0060 inch square.

Predesigned and interconnect leads 18 formed in a beam tape strip on a polyimide layer having said apertures 20 can be aligned with the structure to be bonded at a bonding station.

In the preferred embodiment, the traces are 1 ounce (0.0014 inch) copper traces that have a hardness of approximately 60 to 100 Knoop, which have been chemically milled to the desired pattern. Beam widths and spaces in the range of approximately 0.0025 to 0.0030 can be achieved with currently known chemical milling techniques. The copper traces are plated to a thickness of thirty (30) microinches with 99.99% pure gold.

Once the copper trace beam tape is properly aligned to the structure, a commercial bonding machine, such as a Hughes Aircraft 2460-2 wirebonder, is used to attach the trace leads 18 to the pads through the vias 10 and 12. In the preferred embodiment, approximately 130 grams force is applied for about 50 milliseconds with approximately 130 microinches of about 60 kHz ultrasonic scrub. These bonding parameters yield a mean pull strength of approximately 40 grams with a standard deviation of about 4.0 grams. A range of about 100 to 140 grams for 30 to 80 milliseconds with 100 to 150 microinches of 60 kHz scrub will suffice to provide a proper connection.

In the best mode for practicing the TAB process described, single point TAB techniques are applicable.

A major advantage of the present invention as shown in FIG. 3 is that pads can be located anywhere on the device since topology remains as close to planar as possible.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. Similarly, any process steps described might be interchangeable with other steps in order to achieve the same result. The embodiment was chosen and described in order to best explain the principles of the invention and its practical application to thereby enable others skilled in the art to understand the invention for various embodiments and with various modifications as are suited to the particular use contemplated. It is intended that the scope of the invention be defined by the claims appended hereto and their equivalents.

What is claimed is:

1. A tape automated bonding method for a thin film structure, having a substrate, a contact region in a surface of said substrate, and at least one passivation layer superposing said surface, comprising:
   forming a via in said passivation layer to an area of said contact region;
   superposing a conductive tape beam across said via in said passivation layer, said conductive tape beam including a conductive layer and a support layer, said support layer having a support layer via corresponding in position to said via in said passivation layer;
   applying first force to said beam to deform said beam into said via and into contact with said contact region; and,
   maintaining said first force to hold said beam in contact with said contact region while applying a second force to said beam to bond said beam to said contact region.

2. The method as set forth in claim 1 wherein said step of applying a first force comprises:
   applying approximately 100 to 140 grams linearly for 30 to 80 milliseconds.

3. The method as set forth in claim 2 wherein said step of applying a second force comprises:
applying 100 to 150 microinches of 60 kHz ultrasonic scrub.

4. The method as set forth in claim 3 wherein said tape is formed of copper having a thickness of approximately 0.0014 inch, hardness in the range of approximately 60 to 100 Knoop, and plating with 99.99% gold to a thickness of approximately 30 micro-inches.

5. The method as set forth in claim 4, Wherein said tape chemically milled to a predetermined pattern, such that each beam has a width in the range of approximately 0.0025 to 0.0030 inch.

* * * * *